(12) United States Patent
Alapati et al.

(10) Patent No.: US 7,867,843 B2
(45) Date of Patent: Jan. 11, 2011

(54) GATE STRUCTURES FOR FLASH MEMORY AND METHODS OF MAKING SAME

(75) Inventors: Ramakanth Alapati, Boise, ID (US); Ardavan Niroomand, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 823 days.

(21) Appl. No.: 11/615,321

(22) Filed: Dec. 22, 2006

(65) Prior Publication Data

US 2008/0149987 A1 Jun. 26, 2008

(51) Int. Cl.
*H01L 21/336* (2006.01)
(52) U.S. Cl. .................. 438/257; 438/593; 438/211; 257/E21.422
(58) Field of Classification Search .......... 257/E21.422; 438/257, 593, 211
See application file for complete search history.

(56) References Cited

U.S. PATENT DOCUMENTS

| | | | | |
|---|---|---|---|---|
| 5,328,810 | A | * | 7/1994 | Lowrey et al. ............ 430/313 |
| 7,153,778 | B2 | | 12/2006 | Busch et al. |
| 2001/0039107 | A1 | * | 11/2001 | Suguro ..................... 438/585 |
| 2005/0212034 | A1 | * | 9/2005 | Sasago et al. ............. 257/315 |
| 2005/0260859 | A1 | * | 11/2005 | Deshpande et al. ........ 438/719 |
| 2006/0172498 | A1 | * | 8/2006 | Yamaguchi et al. ........ 438/287 |
| 2006/0211260 | A1 | | 9/2006 | Tran et al. |
| 2007/0077780 | A1 | * | 4/2007 | Wang et al. ............... 438/780 |

* cited by examiner

*Primary Examiner*—Davienne Monbleau
*Assistant Examiner*—Matthew Reames
(74) *Attorney, Agent, or Firm*—John N. Greaves

(57) ABSTRACT

A process may include forming a polysilicon pinnacle above and on a polysilicon island and further forming a floating gate from the polysilicon pinnacle and polysilicon island. The floating gate can bear an inverted T-shape. The floating gate can also be disposed above an isolated semiconductive substrate such as in a shallow-trench isolation semiconductive substrate. Electronic devices may include the floating gate as part of a field effect transistor.

15 Claims, 16 Drawing Sheets

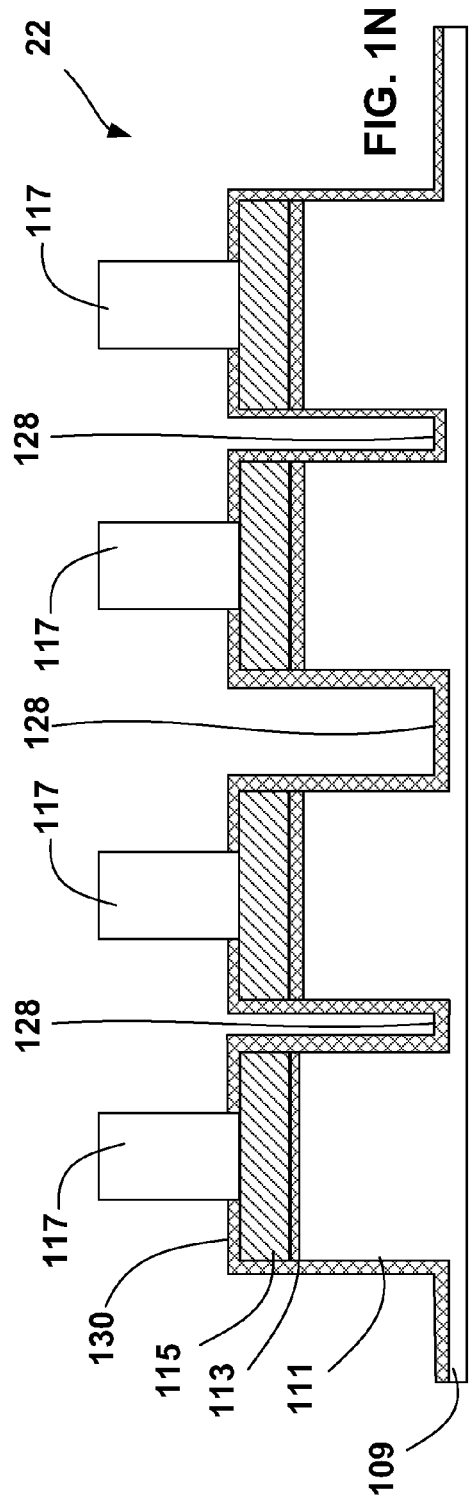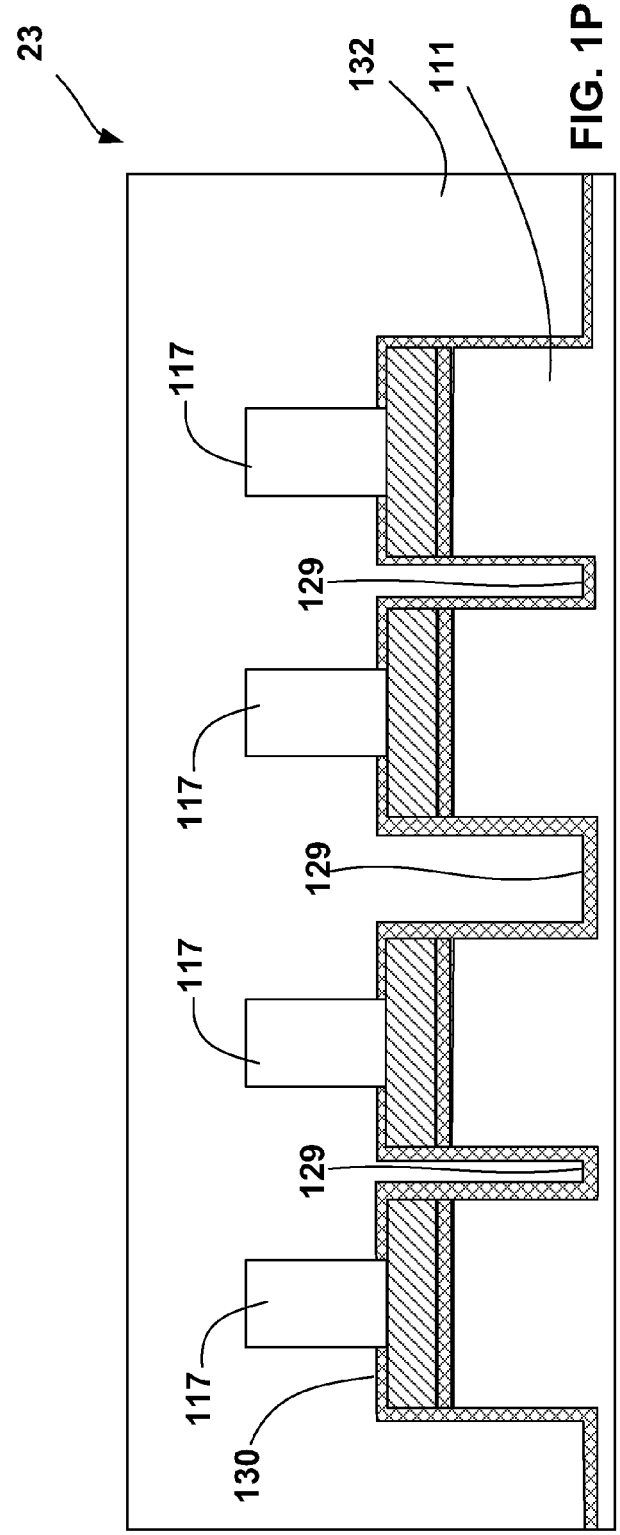

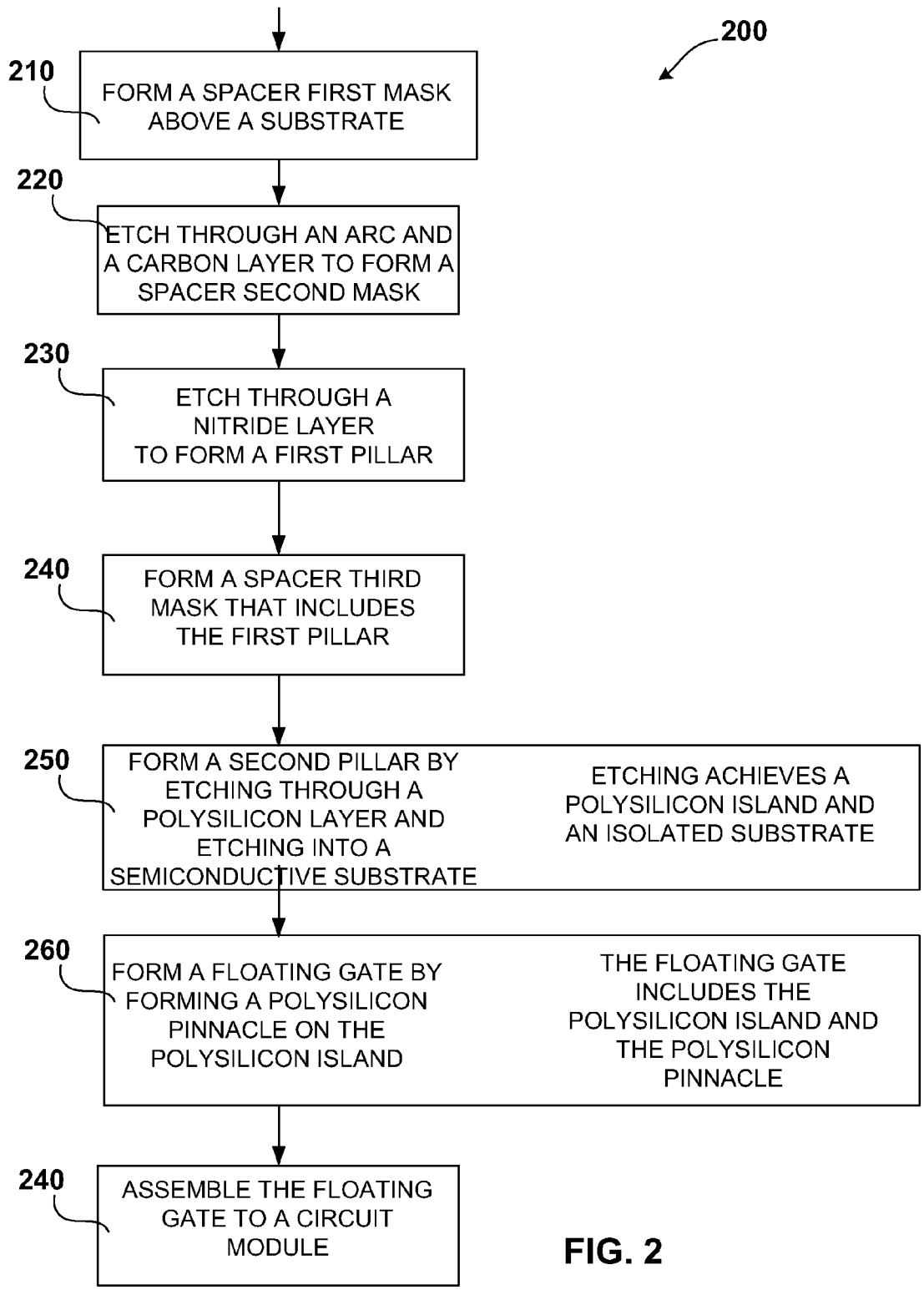

US 7,867,843 B2

GATE STRUCTURES FOR FLASH MEMORY AND METHODS OF MAKING SAME

TECHNICAL FIELD

This disclosure relates generally to non-volatile memory semiconductor devices, including flash memory arrays.

BACKGROUND

Flash memory is non-volatile, which means that it stores information so that the memory does not need power to maintain the information. Flash memory data may be stored in floating gates (FGs), which are part of a field effect transistor (FET), and which gates are relatively isolated from other structures in a semiconductor device. The floating gates may be based on the floating-gate avalanche-injection metal oxide semiconductor (FAMOS transistor) which is essentially a complimentary metal oxide semiconductor (CMOS) FET that includes the FG isolated between the gate and source/drain terminals. The pressure upon the microelectronic device fabricator to ever miniaturize, motivates reducing the size of back-end-of-line (BEOL) structures such as the metallization.

BRIEF DESCRIPTION OF THE DRAWINGS

The above mentioned issues are addressed by the present disclosure and will be understood by reading and studying the following specification, of which the Figures are a part.

FIG. 1N is a cross-section elevation of the semiconductor device depicted in FIG. 1M after further processing;

FIG. 1P is a cross-section elevation of the semiconductor device depicted in FIG. 1M after further processing;

FIG. 2 is a process flow diagram that illustrates selected process embodiments;

DETAILED DESCRIPTION

Figure 1A:
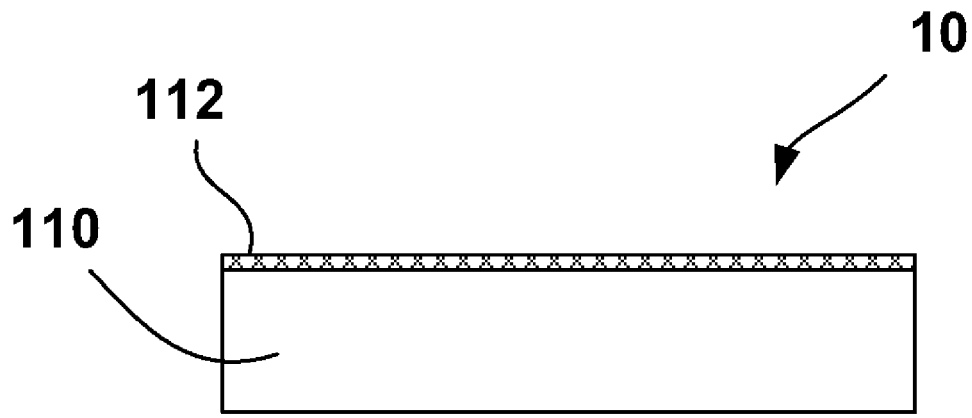
FIG. 1A is a cross-section elevation of a semiconductor device during processing according to an embodiment.

FIG. 1A is a cross-section elevation of a semiconductor device 10 during processing according to an embodiment. In some embodiments of the invention, the semiconductive substrate 110 comprises a bulk semiconductor that is derived from a semiconductor wafer. In an embodiment, the semiconductive substrate 110 comprises monocrystalline silicon such as wafer-level or epitaxial-level silicon. In an embodiment, the semiconductive substrate 110 may be disposed upon an insulator layer such as silicon-on-insulator (SOI). The insulator layer can also be an oxide layer such as a thermally grown silicon oxide, upon the semiconductive substrate 110. A dielectric layer 112 is disposed upon the semiconductive layer 110.

Figure 1B:
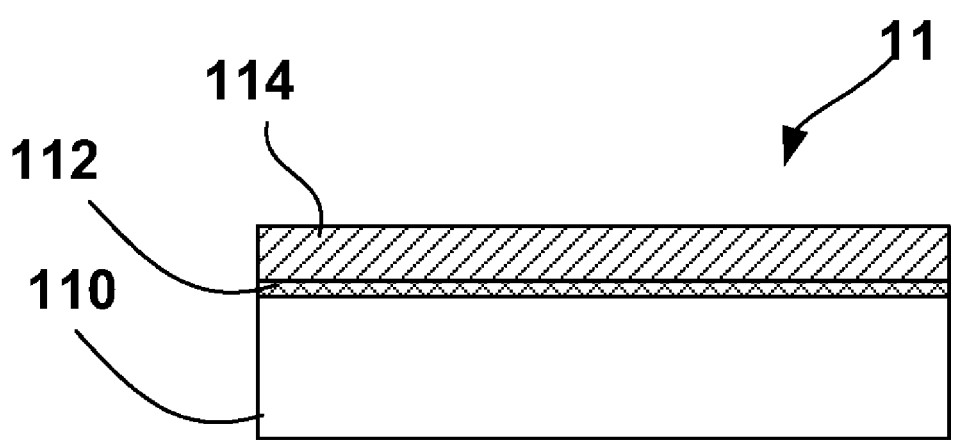
FIG. 1B is a cross-section elevation of the semiconductor device depicted in FIG. 1A after further processing.

FIG. 1B illustrates the semiconductor device depicted in FIG. 1A during further processing according to an embodiment. The semiconductor device 11 exhibits a polysilicon layer 114 that is disposed above the dielectric layer 112. The polysilicon layer 114 can be doped to facilitate either N-type or P-type semiconductance. In an embodiment, the polysilicon layer 114 is made of non-silicon semiconductor such as gallium arsenide (GaAs) or the like. In an embodiment, a combination of silicon and GaAs can be used.

Figure 1C:
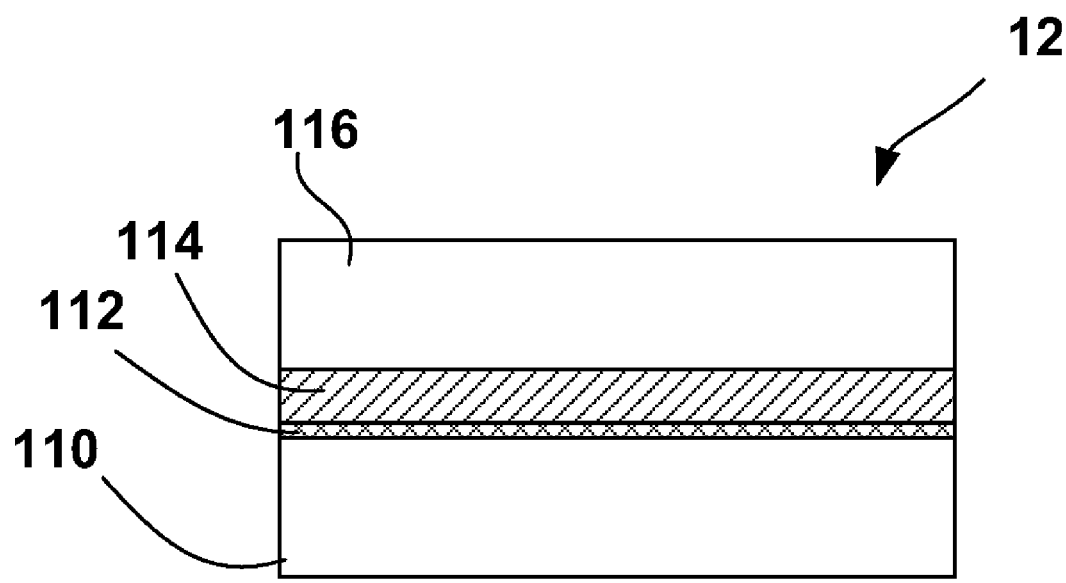
FIG. 1C is a cross-section elevation of the semiconductor device depicted in FIG. 1B after further processing.

FIG. 1C illustrates the semiconductor device depicted in FIG. 1B during further processing according to an embodiment. The semiconductor device 12 exhibits a nitride layer 116 that is formed over the polysilicon layer 114. The nitride layer 116 can be silicon nitride, $Si_xN_y$. Other nitride materials can be used in place of a silicon nitride material.

Figure 1D:
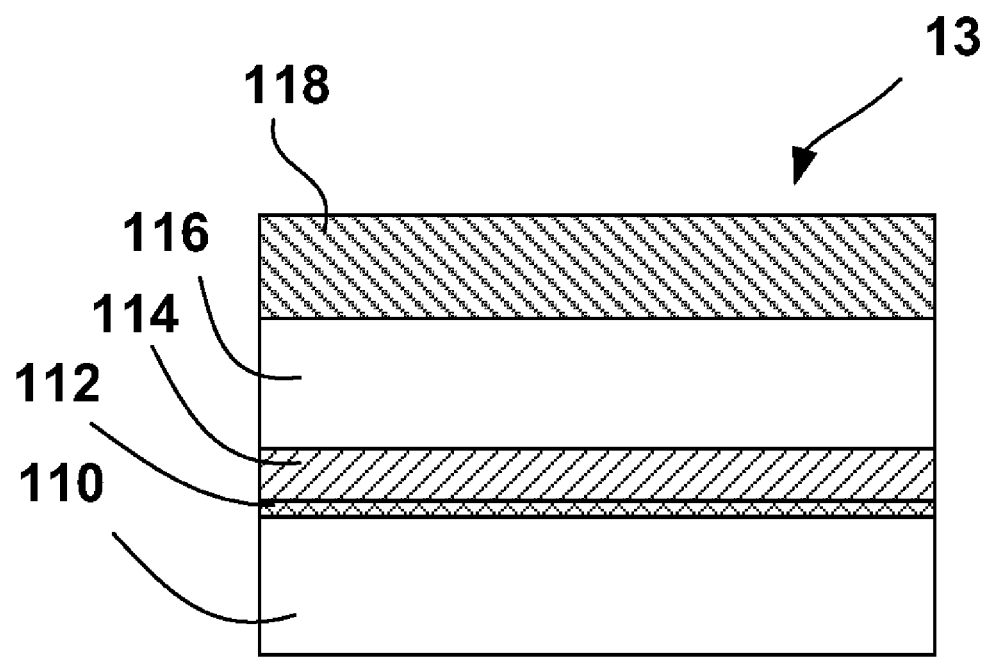
FIG. 1D is a cross-section elevation of the semiconductor device depicted in FIG. 1C after further processing.

FIG. 1D is a cross-section elevation of the semiconductor device depicted in FIG. 1C after further processing. The semiconductor device 13 illustrates that the nitride layer 116 has been overlaid with a carbon layer 118. In an embodiment, the carbon layer 118 is formed by depositing amorphous carbon (a-C) onto the nitride layer in a plasma environment. In an embodiment, the carbon layer 118 is an a-C layer that is formed by using a plasma enhanced chemical vapor deposition (PECVD) process. The device 13 is placed into a PECVD chamber; then the chamber is set to a temperature of between about 400° C. and about 650° C. In an embodiment, the chamber is set to a temperature of about 550° C. At temperature, propylene ($C_3H_6$) is introduced into the chamber at a flow rate of between about 300 standard cubic centimeters per minute (sccm) and about 1,500 sccm. In an embodiment, the propylene flows at about 600 sccm. Helium (He) is used as a carrier gas at a flow rate of between about 200 sccm and about 2,000 sccm. If used, the helium may assist in the formation of a more uniform layer of a-C. During the introduction of gasses, the PECVD chamber is subjected to a radio frequency (RF) power of between about 100 watts (W) and about 1,000 W. In an embodiment, the RF power is about 700 W, and a pressure of between about 4.0 Torr and about 8.0 Torr is used. In an embodiment, a pressure of about 6.0 Torr is used. This process forms an a-C layer.

Figure 1E:
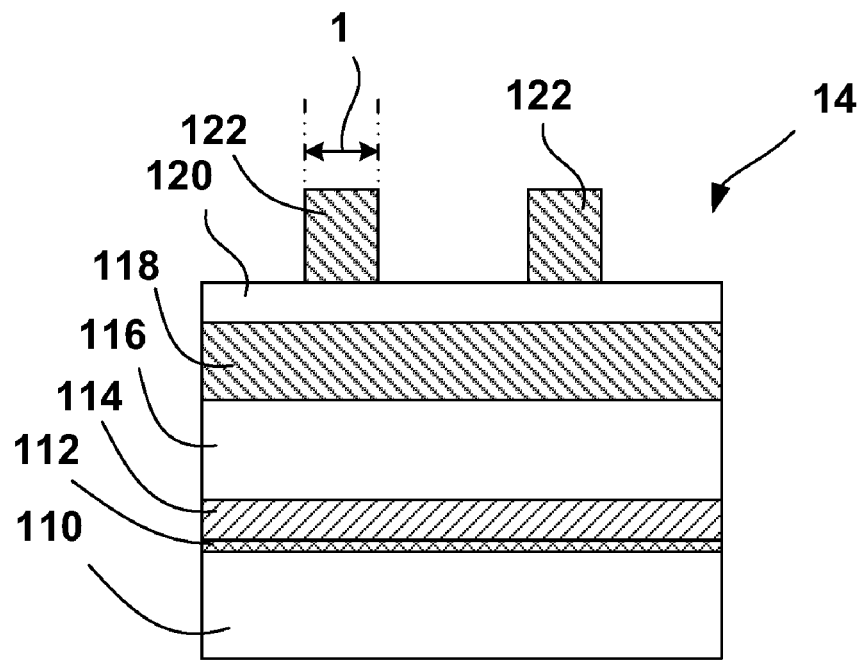
FIG. 1E is a cross-section elevation of the semiconductor device depicted in FIG. 1D after further processing.

FIG. 1E is a cross-section elevation of the semiconductor device depicted in FIG. 1D after further processing. The semiconductor device 14 illustrates that the carbon layer 118 has been overlaid with an antireflective coating (ARC) layer 120. Further, the ARC layer 120 has been used as a base for a patterned mask 122, two occurrences of which are depicted in FIG. 1E. The patterned mask 122 can be referred to herein and in the appended claims as a "first mask 122." In an embodiment, the patterned mask 122 is a photoresist that has been spun onto the ARC layer 120 and patterned. In an embodiment, the patterned mask 122 is a carbon material that has been oxygen or oxidizing-vapor etched. In an embodiment, the lateral dimension of the patterned mask 122 is in a range from about 48 nanometer (nm) to about 60 nm. In an embodiment, the lateral dimension 1 of the patterned mask 122 is about 54 nm.

Various structures can be made to form the ARC layer 120. Although the ARC layer 120 is depicted as a single layer, it can be a double layer according to an embodiment, or even a triple layer.

An example ARC structure that is represented as the ARC layer 120 is a polysilicon first layer having a thickness of less than about 500 Å and a grain size in a range from about 500 Å to about 2,500 Å. The polysilicon first layer can resist fouling of a semiconductor substrate 110 above which the first layer of polysilicon is situated. The polysilicon first layer has the ability to scatter unabsorbed light into patterns and intensities that are substantially ineffective to photoresist material exposed to the patterns and intensities.

A nitride material second layer is formed substantially conformably upon the first layer of polysilicon according to an embodiment. The nitride material second layer has a thickness in a range from about 200 Å to about 1,000 Å, is substantially composed of a material that also resists fouling of the semiconductor substrate, and that absorbs a substantial portion of patterning light that penetrates the photoresist material. The nitride material second layer may optionally be used in subsequent processing such as an etch stop. One material for the nitride material second layer is silicon nitride. The nitride material second layer may be formed by chemical vapor deposition (CVD) or by thermal transformation of a portion of the first layer of polysilicon into a combined polysilicon layer and a silicon nitride layer.

One useful ARC layer 120 includes a polysilicon first layer disposed above the carbon layer 118, a nitride material second layer disposed substantially conformably upon the polysilicon first layer, and a polysilicon third layer that may or may not be substantially composed of the same material as that of the polysilicon first layer, and the precursor of the patterned mask 122 disposed upon the polysilicon second layer.

In an embodiment, grain-size control is used to achieve the effect of dissipating reflected light into light patterns or intensities from the ARC layer 120 that are substantially inconsequential in affecting regions of photoresist that are exposed to said intensities and patterns. Control of grain size may include preparing the a-C layer 118 surface by texturing it with an etch or an equivalent treatment.

Figure 1F:
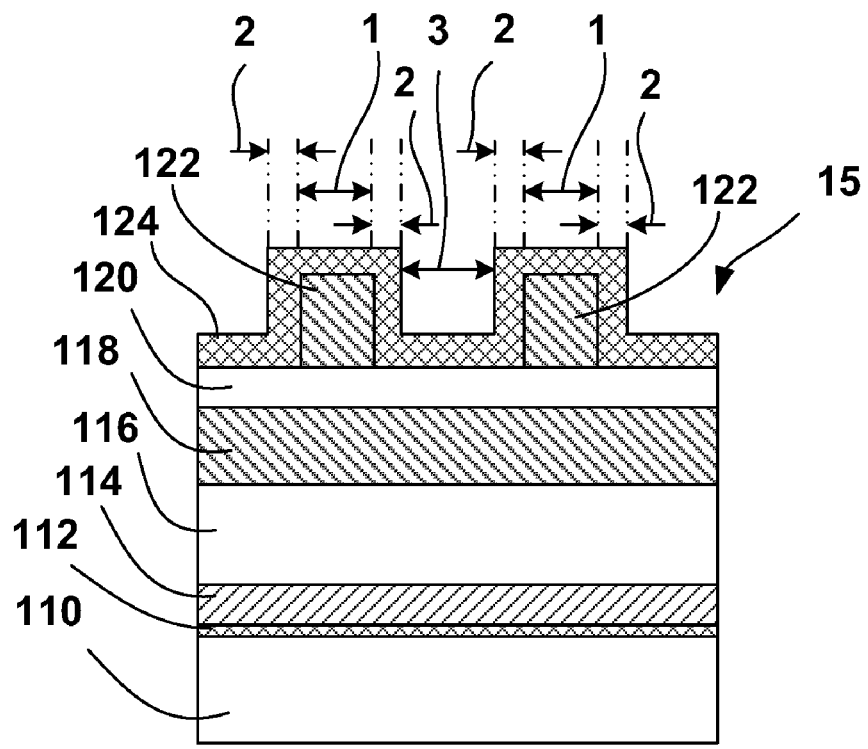
FIG. 1F is a cross-section elevation of the semiconductor device depicted in FIG. 1E after further processing.

FIG. 1F is a cross-section elevation of the semiconductor device depicted in FIG. 1E after further processing. The semiconductor device 15 illustrates that the patterned mask 122 has been overlaid with a spacer precursor layer 124. In an embodiment, the spacer precursor layer 124 is an oxide material such as silicon oxide that is formed by the decomposition of tetraethyl ortho silicate (TEOS) in a plasma environment. In an embodiment, the thickness of the spacer precursor layer 124 is in a range from about 14 nm to about 22 nm. In an embodiment, the thickness of the spacer precursor layer 124 is about 18 nm. In an embodiment, where the lateral dimension of the first mask 122 is about 54 nm, the thickness of the spacer precursor layer 124 is about 18 nm.

As depicted, the lateral dimension 1 of the patterned mask 122 can be substantially equal to the spacing 3 between two occurrences of the spacer precursor layer 124, which can about one-third the lateral dimension 1 of the patterned mask 122. Therefore in an embodiment, the first mask 122 has a lateral dimension 1 of 54 nm, the recess between the two occurrences of the first mask 122 and the spacer precursor layer 124 has a lateral dimension 3 of 54 nm, and the spacer precursor layer 124 has a lateral dimension 2 of 18 nm.

Figure 1G:
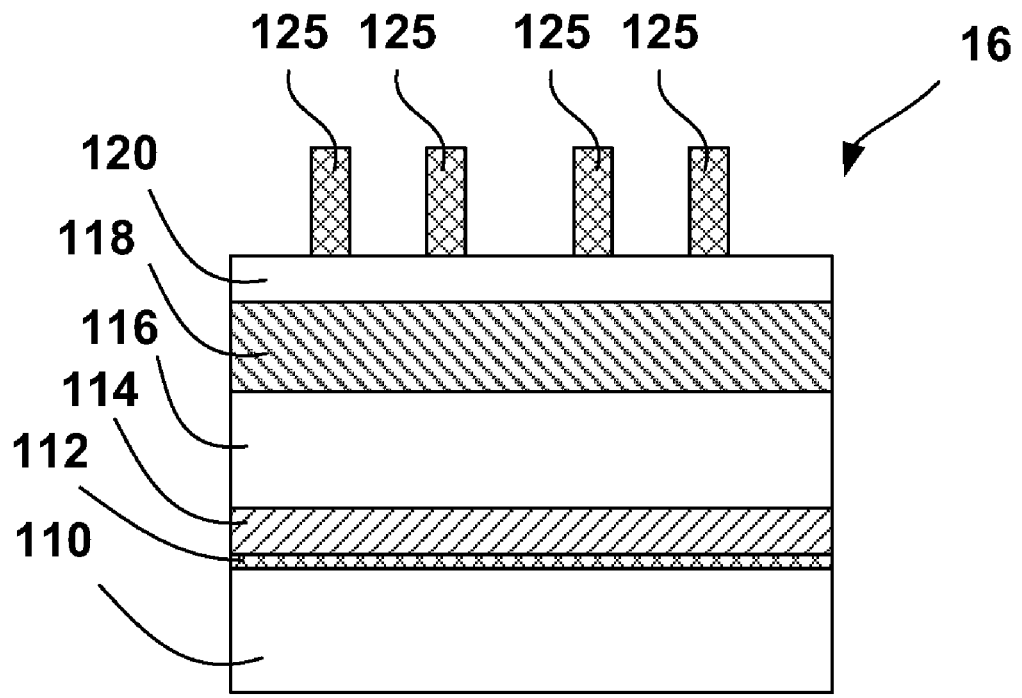
FIG. 1G is a cross-section elevation of the semiconductor device depicted in FIG. 1F after further processing.

FIG. 1G is a cross-section elevation of the semiconductor device depicted in FIG. 1F after further processing. The semiconductor device 16 illustrates that the spacer precursor layer 124 (FIG. 1F) has been spacer etched to form a spacer mask 125, four occurrences of which are depicted in FIG. 1G. The spacer mask 125 can be referred to herein and in the appended claims as a "spacer first mask 125." In an embodiment, an anisotropic spacer etch is carried out that removes vertically exposed surfaces of the spacer precursor layer 124, without obliterating the laterally exposed surfaces thereof. In an embodiment, the remaining structures of the patterned mask 122, depicted in FIG. 1F, are removed by an oxidation process if the patterned mask 122 is a carbon material or a carbon-based photoresist material. For example, the carbon material can be removed by an oxygen-based stripping process or an ammonium-based stripping process.

Figure 1H:
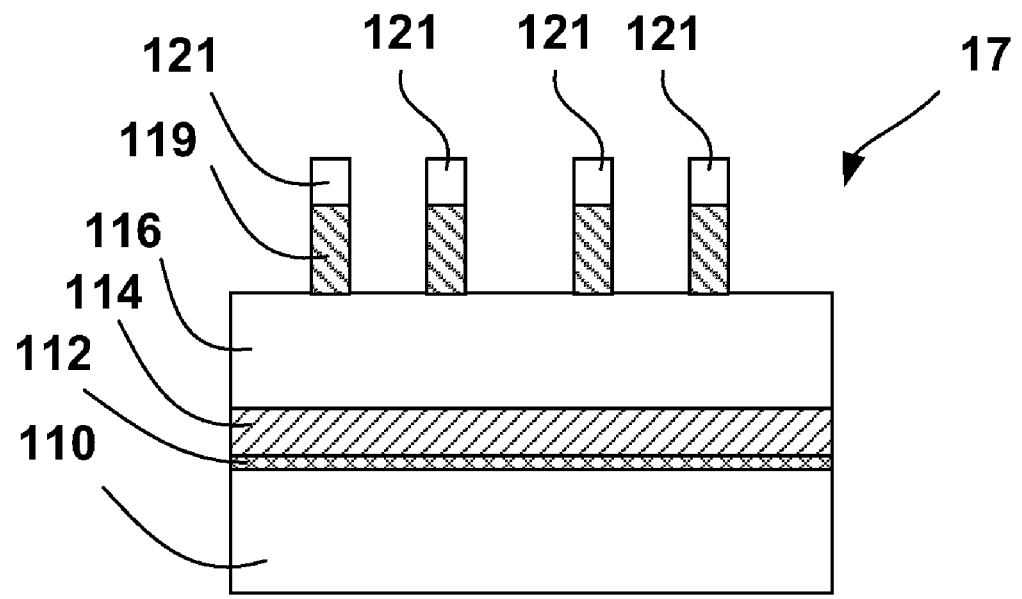
FIG. 1H is a cross-section elevation of the semiconductor device depicted in FIG. 1G after further processing.

FIG. 1H is a cross-section elevation of the semiconductor device depicted in FIG. 1G after further processing. The semiconductor device 17 illustrates that the spacer first mask 125 (FIG. 1G) has been removed during an etch process, but the ARC layer 120 and the carbon layer 118 depicted in FIG. 1G have also been etched. The ARC layer 120 has been transformed into a plurality of ARC spacer masks 121, and the carbon layer 118 has been transformed into a plurality of carbon spacer masks 119. The nitride layer 116 has acted as an etch stop for this process. The ARC spacer mask 121 and the carbon spacer mask 119 can be referred to herein and in the appended claims as a "spacer second mask." The spacer second mask is self-aligned to the etch shadow of the spacer first mask.

Figure 1J:
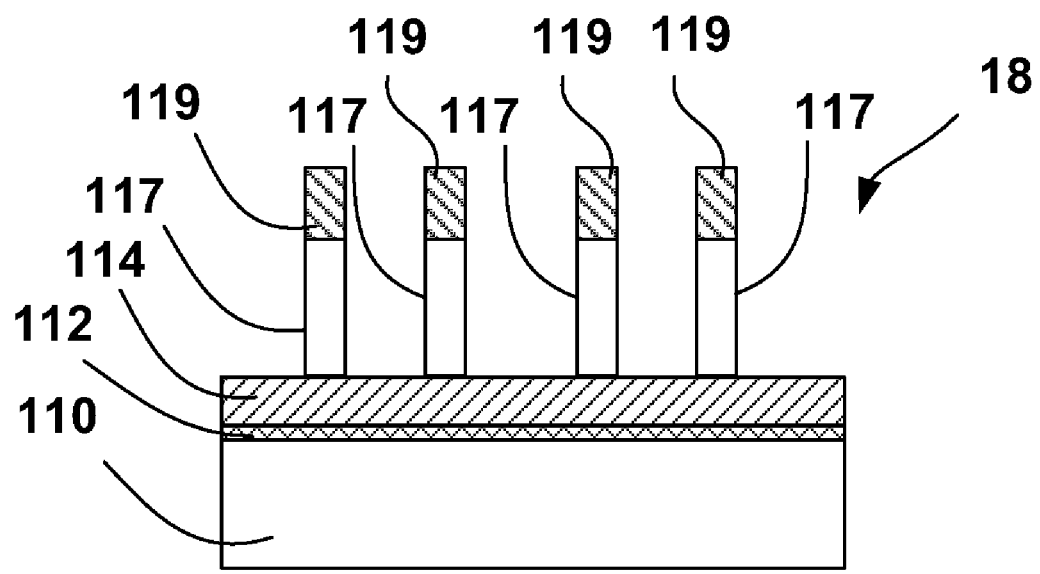
FIG. 1J is a cross-section elevation of the semiconductor device depicted in FIG. 1H after further processing.

FIG. 1J is a cross-section elevation of the semiconductor device depicted in FIG. 1H after further processing. The semiconductor device 18 illustrates that the spacer second mask 119 and 121 (FIG. 1H) has been altered during an etch process, but the carbon spacer mask 119 and the nitride layer 116 depicted in FIG. 1H have also been etched. The nitride layer 116 has been transformed into a plurality of nitride spacer masks 117. The nitride spacer mask 117 can be referred to herein and in the appended claims as a "portion of the nitride layer." The polysilicon layer 112 has acted as an etch stop for this process. In an embodiment, the etch process uses a fluorine etch recipe. In an embodiment, the etch process uses a fluorine etch recipe that includes carbon tetrafluoride ($CF_4$). In an embodiment, the etch process uses a fluorine etch recipe that includes ethylene fluoride ($CH_2F_2$). In an embodiment, both carbon tetraflouride and ethylene fluoride are used. Other fluorocarbon compounds can be used.

In an embodiment, the fluorocarbon etchant may include octofluoro butane ($C_4F_8$). In an embodiment, the fluorocarbon etchant may include hexafluoro cyclobutene ($C_4F_6$). In an embodiment, two fluorocarbon compounds may be used, and they may include two of $C_4F_8$, $C_4F_6$, $CF_4$, and $CH_2F_2$. Similarly, any combination of these fluoro compounds can be used, up to all four and others.

In a first example embodiment, the semiconductor device 18 (FIG. 1J) is placed in an etch tool and subjected to a plasma etch with argon, helium, oxygen, octofluoro butane, and hexafluoro cyclobutene. In some embodiments, the etch process may be carried out within a pressure range from about 20 milliTorr to about 140 milliTorr.

In a second example embodiment, the semiconductor device 18 is subjected to a plasma etch with about 300 sccm argon, about 20 sccm helium with about 30% oxygen, about 11 sccm octofluoro butane, and about 4 sccm hexafluoro cyclobutene. In some embodiments, the etch process may be carried out in a reduced-pressure environment, such as below one atmosphere, including about 50 milliTorr.

In a third example embodiment, the semiconductor device 18 may be subjected to a plasma etch with about three parts octofluoro butane to about one part hexafluoro cyclobutene, at plasma conditions of about 1,350 W and about 2 MHz. In a fourth example embodiment, the semiconductor structure 103 may be subjected to a plasma etch with about three parts octofluoro butane to about one part hexafluoro cyclobutene, at plasma conditions of about 900 W and about 27 MHz.

The structure depicted in FIG. 1J, which includes the carbon spacer masks 119 and the nitride spacer masks 117, can be referred to herein and in the appended claims as a "first pillar."

Figure 1K:
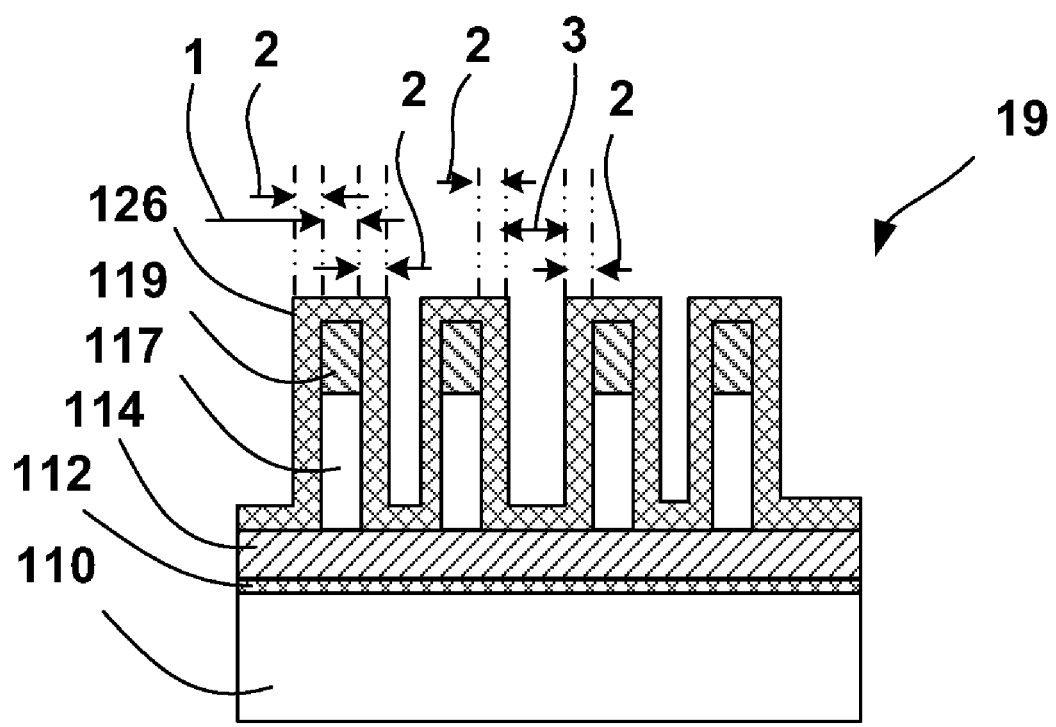
FIG. 1K is a cross-section elevation of the semiconductor device depicted in FIG. 1J after further processing.

FIG. 1K is a cross-section elevation of the semiconductor device depicted in FIG. 1J after further processing. The semiconductor device 19 illustrates that the first pillar (carbon spacer mask 119 and nitride spacer mask 117) has been overlaid with a first pillar-spacer precursor layer 126. In an embodiment, the first pillar-spacer precursor layer 126 is an oxide material such as silicon oxide that is formed by the decomposition of tetraethyl ortho silicate (TEOS) in a plasma environment. In an embodiment, the thickness of the first pillar-spacer precursor layer 126 is in a range from about 14 nm to about 22 nm. In an embodiment, the thickness of the first pillar-spacer precursor layer 126 is about 18 nm. In an embodiment, where the lateral dimension of the first mask 122 (FIG. 1E) is about 54 nm, the thickness of the first pillar-spacer precursor layer 126 is about 18 nm.

As depicted, the lateral dimension 1 of the first pillar 119 and 117 can be substantially equal to the spacing 3 between two occurrences of the first pillar-spacer precursor layer 126, which can also be about equal to the lateral dimension 2 of first pillar-spacer precursor layer 126 mask. Therefore in an embodiment, the first pillar 119 and 117 has a lateral dimension 1 of 18 nm, the recess between the two occurrences of the first pillar 119 and 117 has a lateral dimension 3 of 36 nm, and the first pillar-spacer precursor layer 126 has a lateral dimension 2 also of 9 nm.

Figure 1L:
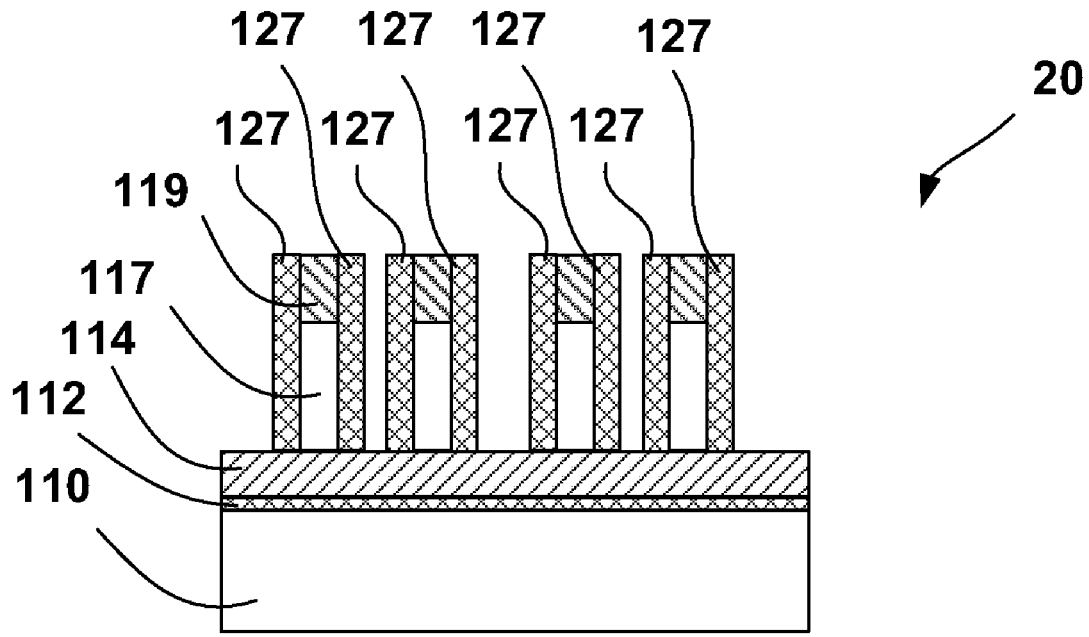
FIG. 1L is a cross-section elevation of the semiconductor device depicted in FIG. 1K after further processing.

FIG. 1L is a cross-section elevation of the semiconductor device depicted in FIG. 1K after further processing. The semiconductor device 20 illustrates that the first pillar-spacer precursor layer 126 (FIG. 1K) has been spacer etched to form a spacer third mask 127, eight occurrences of which are depicted in FIG. 1L. The spacer third mask 127 can be referred to herein and in the appended claims as a "spacer third mask."

In an embodiment, an anisotropic spacer etch is carried out that removes vertically exposed surfaces of the first pillar-spacer precursor layer 126, without obliterating the laterally exposed surfaces thereof. One etch recipe for this etch can include a halogen-based etch recipe. In an embodiment, the etch recipe includes a hydrogen bromide (HBr) component. In an embodiment, the halogen-based etch does not use chlorine.

Figure 1M:
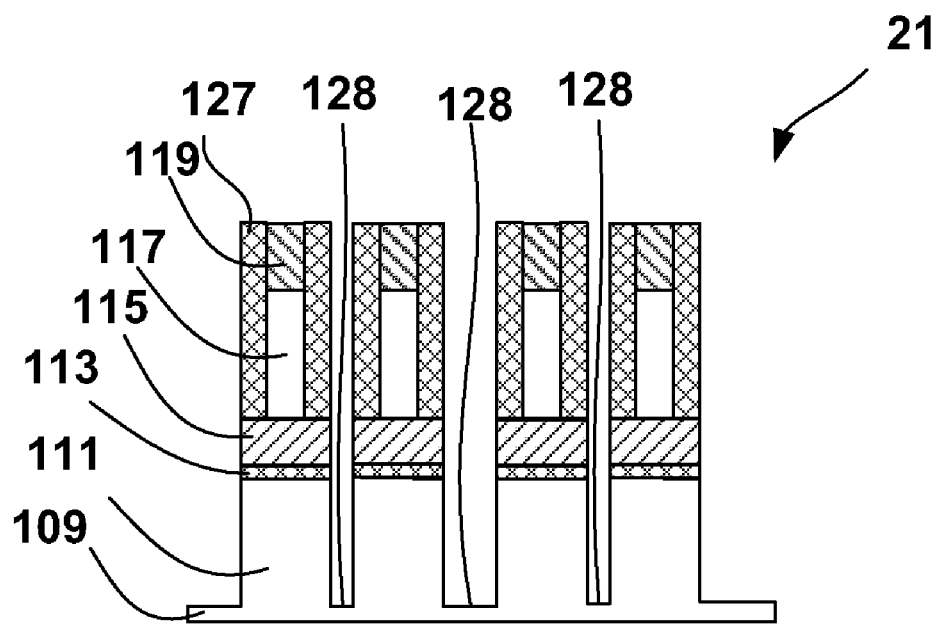
FIG. 1M is a cross-section elevation of the semiconductor device depicted in FIG. 1L after further processing.

FIG. 1M is a cross-section elevation of the semiconductor device depicted in FIG. 1L after further processing. The semiconductor device 21 illustrates processing that includes etching into the semiconductive substrate 110 (FIG. 1L). The etch process has used the spacer third mask 127, and has achieved an etching that has penetrated the polysilicon layer 114 to form a polysilicon island 115. The structure depicted in FIG. 1M, which includes the polysilicon island 115, can be referred to herein and in the appended claims as a "portion of the polysilicon layer."

The etch process has also achieved an etching that has penetrated the dielectric layer 112 to form a dielectric island 113. Further, the etch process has formed a trench 128 in the semiconductive substrate 110 (FIG. 1L), which has resulted in an isolated substrate 111, and a remaining substrate 109. As illustrated in FIG. 1M, there are three occurrences of the recess 128. Etching can also include a halogen-based etch recipe. In an embodiment the halogen-based etch recipe does not use chlorine. The structure depicted in FIG. 1M, which includes the isolated substrate 111 and structures above the isolated substrate 111, can be referred to herein and in the appended claims as a "second pillar." It can be seen also that the isolated substrate 111 is self-aligned below the polysilicon island 115.

FIG. 1N is a cross-section elevation of the semiconductor device depicted in FIG. 1M after further processing. The semiconductor device 22 is illustrated in enlarged form for better viewing. In an embodiment, the remaining structures of the spacer third mask 127 are removed by an oxidation process if the spacer third mask 127 is a carbon material or a carbon-based photoresist material. For example, the carbon material can be removed by an oxygen-based stripping process or an ammonium-based stripping process.

The nitride spacer mask 117 has been laid bare by a stripping process that has removed the spacer third mask 127. In an embodiment, an oxide film 130 has been formed on the isolated substrate 111, the remaining substrate 109, and also on the polysilicon island 115.

FIG. 1P is a cross-section elevation of the semiconductor device depicted in FIG. 1M after further processing. The semiconductor device 23 has been blanket deposited with a dielectric 132, such that the nitride spacer mask 117 has been covered over, and the trench 128 has been filled to form a shallow trench isolation (STI) 129 between two occurrences of the isolated substrate 111. In an embodiment, the dielectric 132 is an oxide such as a silicon oxide produced by the decomposition of TEOS.

Figure 1Q:
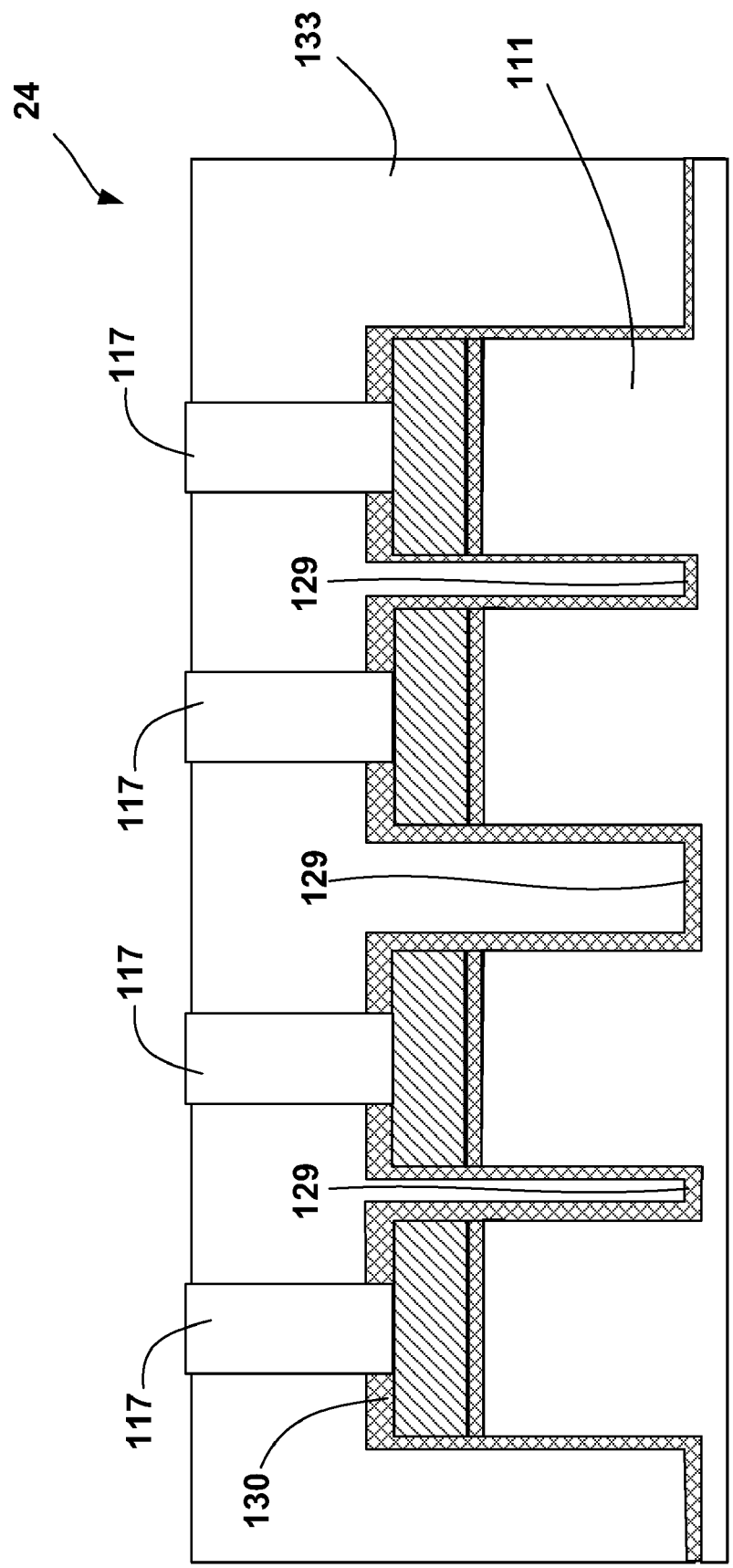
FIG. 1Q is a cross-section elevation of the semiconductor device depicted in FIG. 1P after further processing.

FIG. 1Q is a cross-section elevation of the semiconductor device depicted in FIG. 1P after further processing. The semiconductor device 24 has been etched back to the level of the nitride spacer mask 117, such that the blanket deposited with a dielectric 132 has formed an etched back dielectric 133 that is between the nitride spacer masks 117 and that fills the STIs 129. In an embodiment, the formation of the etched back dielectric 133 is formed by a chemical etch technique that stops on the nitride spacer mask. In an embodiment, the formation of the etched back dielectric 133 is formed by a chemical-mechanical planarization (CMP) technique that stops on the nitride spacer mask.

Figure 1R:
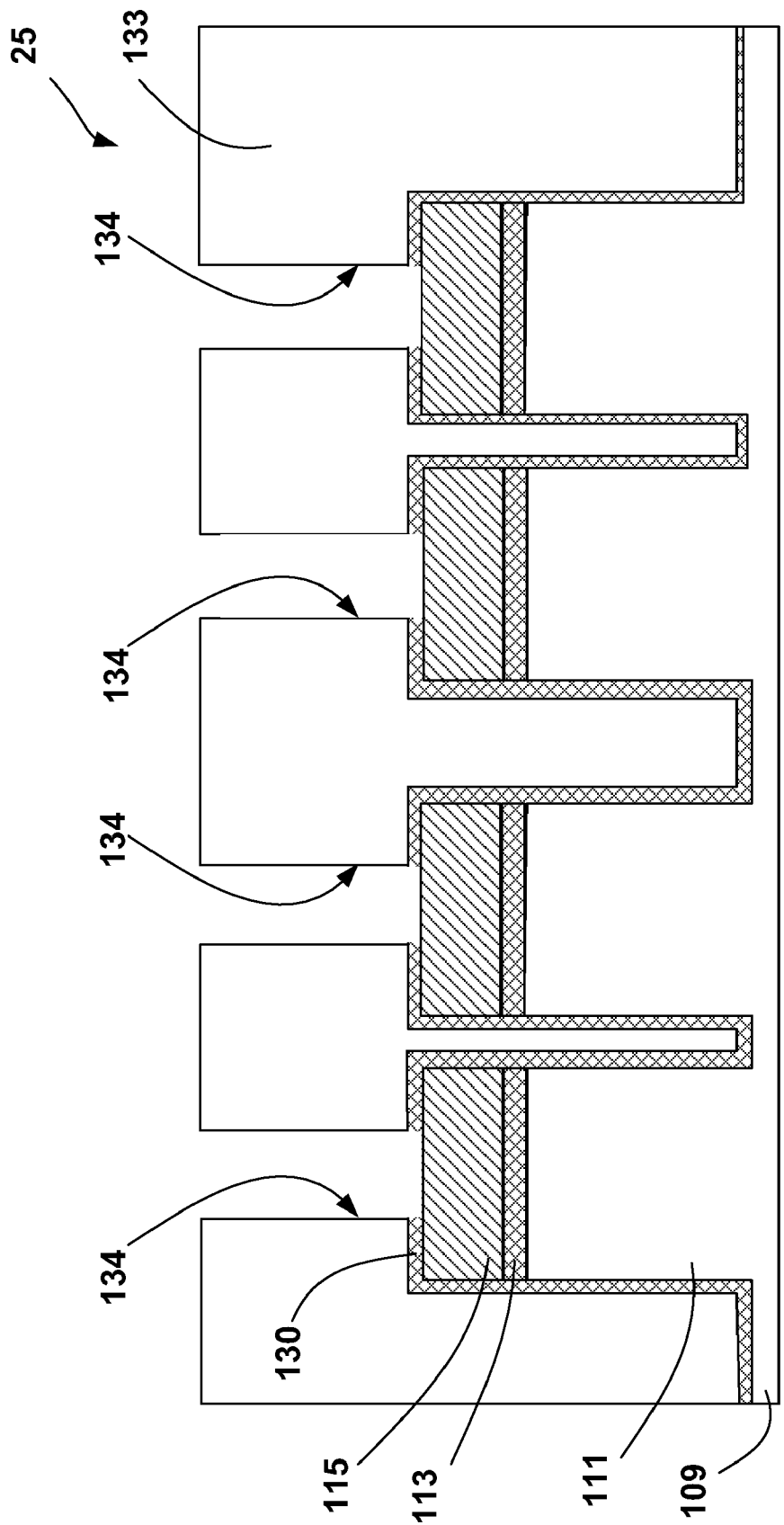
FIG. 1R is a cross-section elevation of the semiconductor device depicted in FIG. 1Q after further processing.

FIG. 1R is a cross-section elevation of the semiconductor device depicted in FIG. 1Q after further processing. The semiconductor device 25 depicts the removal of the nitride spacer mask 117 to form a floating gate pinnacle channel 134

(i.e. a recess) in the etched back dielectric 133. In an embodiment, the nitride spacer mask 117 is removed by a wet fluorocarbon compound etch such as one set forth in this disclosure.

Figure 1S:
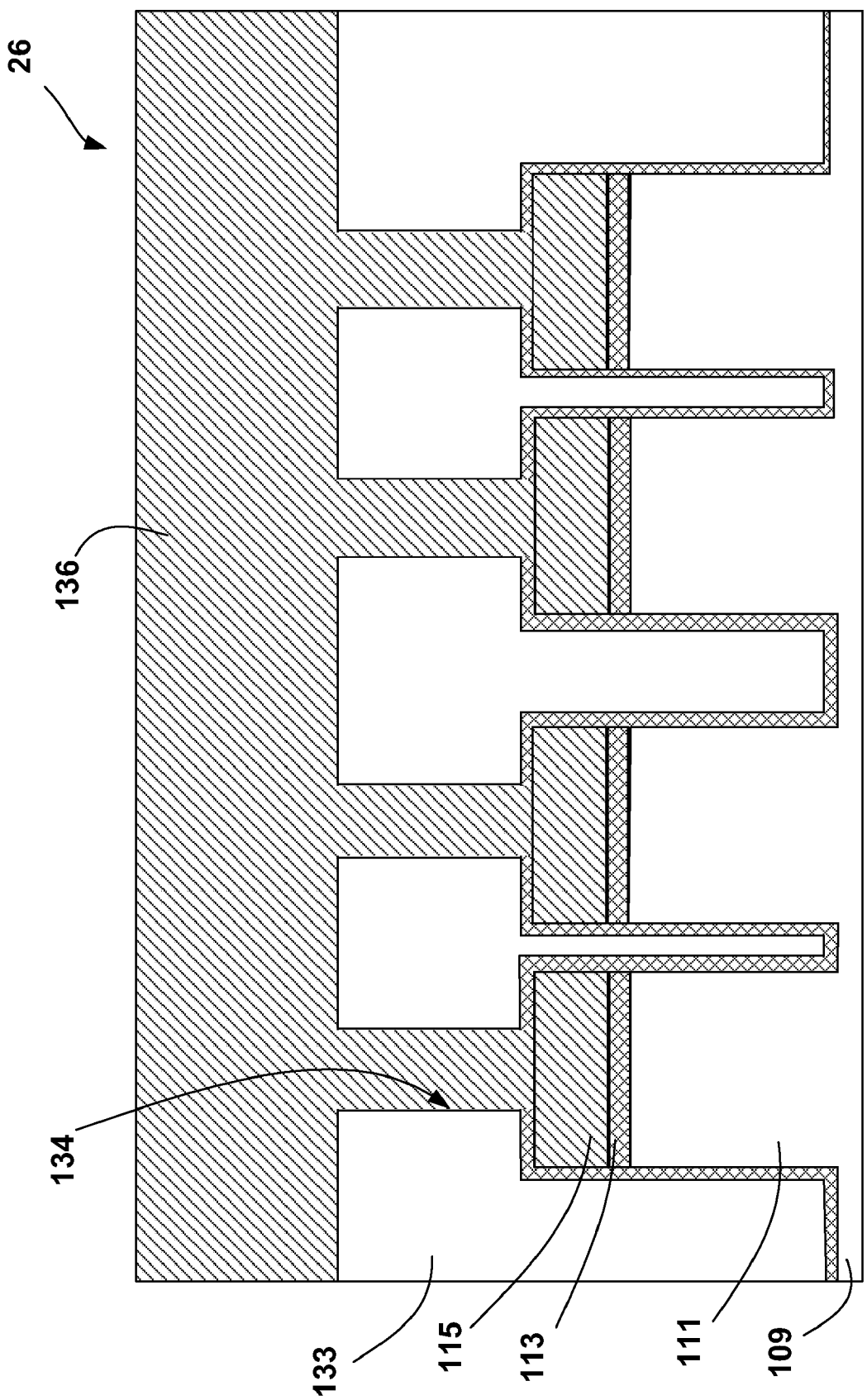
FIG. 1S is a cross-section elevation of the semiconductor device depicted in FIG. 1R after further processing.

FIG. 1S is a cross-section elevation of the semiconductor device depicted in FIG. 1R after further processing. The semiconductor device 26 depicts the fill of a floating gate pinnacle polysilicon 136 over the etched back dielectric 133, and filled into the channel 134 to make direct contact with the polysilicon island 115.

Figure 1T:
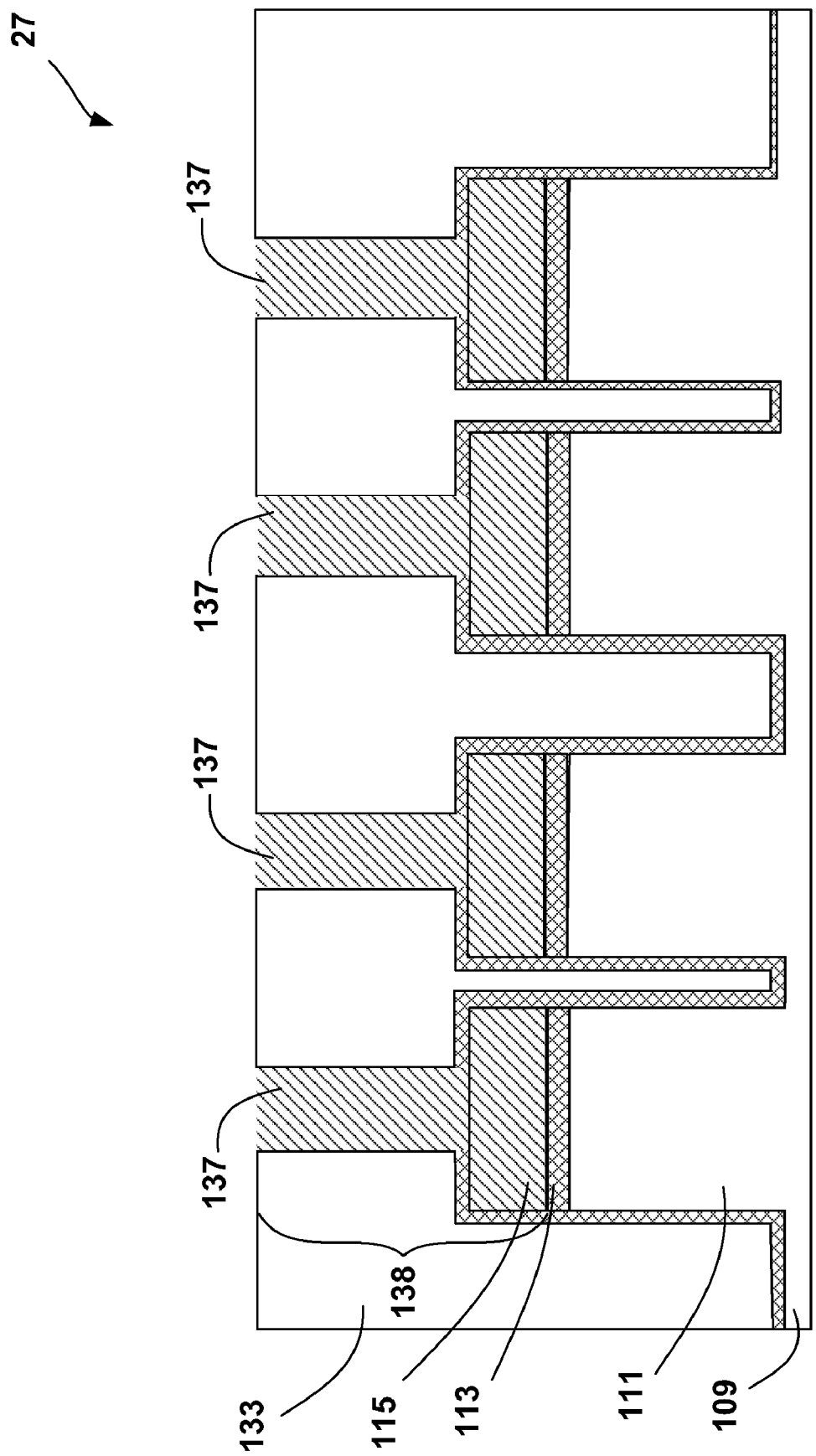
FIG. 1T is a cross-section elevation of the semiconductor device depicted in FIG. 1S after further processing.

FIG. 1T is a cross-section elevation of the semiconductor device depicted in FIG. 1S after further processing. The semiconductor device 27 has been etched back to the level of the etched back dielectric 133, such that the floating gate pinnacle polysilicon 136 depicted in FIG. 1S forms a floating gate pinnacle 137 in the channel 134. Consequently, because the floating gate pinnacle 137 makes direct contact with the polysilicon island 115, the combined structure is an inverted T-shaped floating gate 138 that allows for tight tolerances between adjacent floating gates, but that resists shorting into neighboring floating gates because of the floating gate pinnacles 137 that must be coupled to select gates. In general, the polysilicon island 115 has a first dimension that was related to the lateral dimension of the first mask 122 (FIG. 1E), and the polysilicon pinnacle 137 has a lateral dimension that was related to the lateral dimension of the nitride island 117. Consequently, the first dimension is greater than the second dimension. Similarly, the floating gate 138 may have a variation of an inverted T-shape, such as an "L" shape where the polysilicon pinnacle 137 is not centered above and on the polysilicon island 115.

Further, the total volume of the floating gate 138 is sufficient to hold a charge virtually indefinitely as in an erasable programmable read-only memory such as a non-volatile memory. In an embodiment, the floating gate 138 is a floating gate for a flash memory device.

Spacing between the polysilicon pinnacle that is delineated with several reference numerals, and the immediate neighboring polysilicon pinnacle ("second polysilicon pinnacle"), can be spaced apart on a center in a range from about 30 nm to about 50 nm. In an embodiment, they are spaced apart on a center of about 36 nm.

Figure 1U:
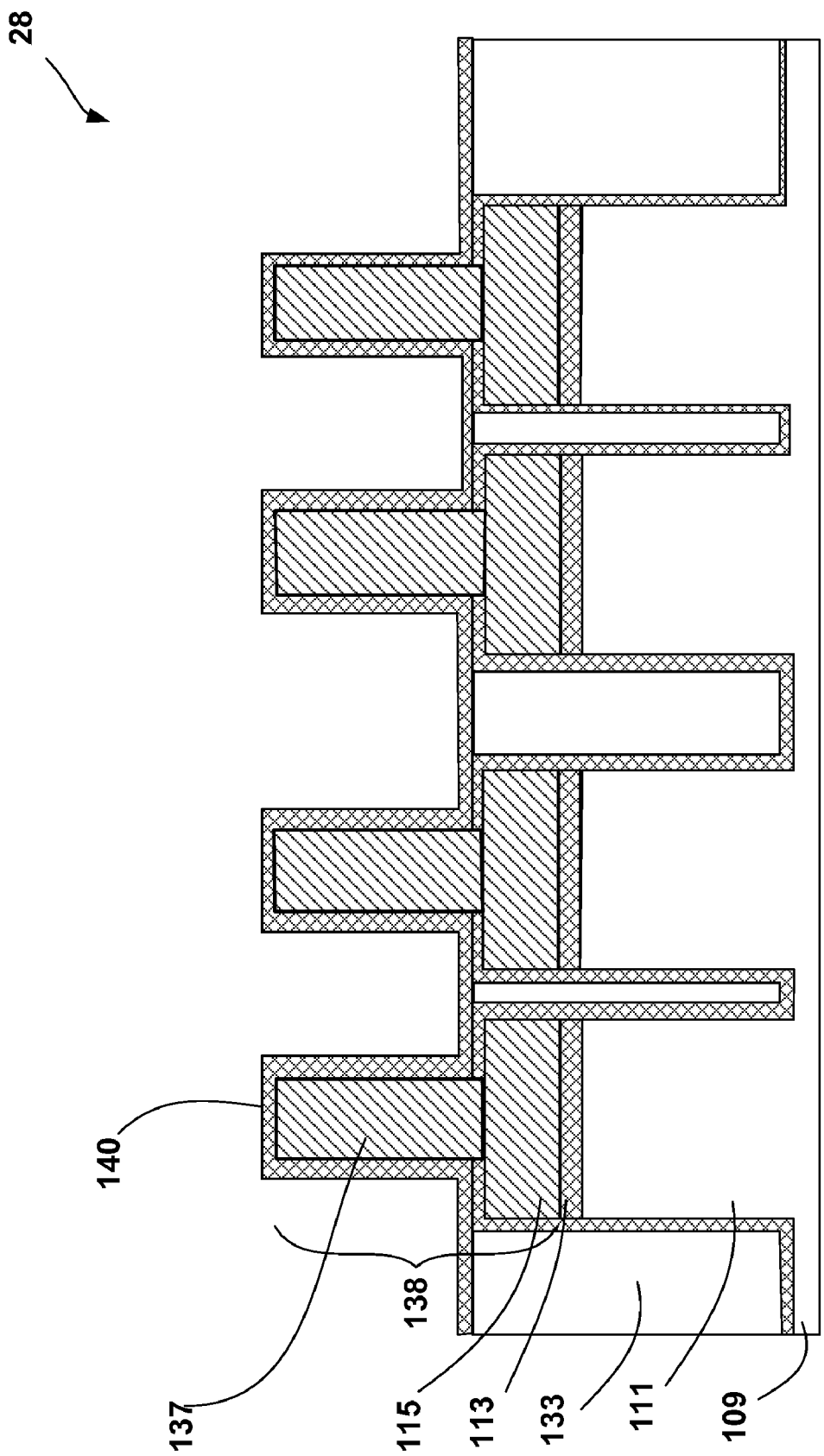
FIG. 1U is a cross-section elevation of the semiconductor device depicted in FIG. 1T after further processing.

FIG. 1U is a cross-section elevation of the semiconductor device depicted in FIG. 1T after further processing. The semiconductor device 28 has processed to form a floating gate select oxide 140. In an embodiment, the floating gate "oxide" 140 is a laminate of an oxide, a nitride, and a second oxide. In an embodiment, the floating gate oxide 140 has a thickness of about 120 Å. In any event, the floating gate oxide 140 is formed to isolate the polysilicon pinnacle 137 and the polysilicon island 115 to achieve the structure of a floating gate 138.

FIG. 2 is a flowchart of a process 200 according to an embodiment. The process includes forming a floating gate according to several embodiments set forth in this disclosure.

At 210, the process includes forming a spacer first mask above a substrate. A non-limiting example is depicted in FIGS. 1E, 1F, and 1G wherein the mask 122 is overlaid with an oxide 124 and spacer etched to form the spacer first mask 125.

At 220, the process includes etching through an ARC layer and a carbon layer to form a spacer second mask. A non-limiting example is depicted in FIG. 1H wherein the ARC layer 120 and the carbon layer 118 are etched to form the spacer second mask 121 and 119.

At 230, the process includes etching through a nitride layer to form a first pillar. A non-limiting example is depicted in FIG. 1J wherein the ARC island 121 is removed and a nitride island 117 is formed below the carbon island 119.

At 240, the process includes forming a spacer third mask that includes the first pillar. A non-limiting example is depicted in FIGS. 1K and 1L wherein the first pillar 119 and 117 is overlaid with an oxide 126 and spacer etched to form the spacer third mask 127.

At 250, the process includes forming a second pillar by etching through a polysilicon layer and etching into a substrate. A non-limiting example is depicted in FIG. 1M wherein the spacer third mask 127 is used to etch through the polysilicon layer 114 and into the substrate 110.

At 260, the process includes forming a floating gate by forming a polysilicon pinnacle on the polysilicon island. A non-limiting example is depicted in FIGS. 1N through 1T wherein the polysilicon pinnacle 137 is formed in direct contact with the polysilicon island 115 to form an inverted-T shaped floating gate.

At 270, a method embodiment includes assembling the floating gate to a circuit module.

FIGS. 3 through 8 illustrate other embodiments. The processes and structures that are achieved in the various embodiments are applicable to a variety of devices and apparatuses. Specific systems can be made by process embodiments, or can include an embodiment or embodiments of the structures disclosed. For example, a chip package can contain an inverted T-shaped floating gate 138 such as is depicted in FIG. 1T or FIG. 1U. In an embodiment, the gate select 142 is arranged to run in the plane of the page, such that a single gate select runs along the gate oxide 140 to be a gate select for the four illustrated floating gates.

In an embodiment, the floating gate is part of an electrical device that includes the semiconductor substrate in a chip package and the chip package is part of a memory module or part of a chipset. In another embodiment, the memory module is part of a DRAM module that is inserted into a host such as a motherboard or a digital computer. In another embodiment, specific systems can be made that include the floating gate. For example, a chip package may contain a substrate such as one set forth in this disclosure. In another embodiment, the floating gate is part of an electrical device that includes the semiconductor substrate in a chip package and the chip package is part of a memory module or part of a chipset. In another embodiment, the memory module is part of a flash DRAM module that is inserted into a host such as a motherboard or a digital computer. In another embodiment, the floating gate is part of an electronic system. In another embodiment, the floating gate is part of a flash memory device that in turn is part of a chipset such as a basic input-output system (BIOS) for an electrical device.

Figure 3:
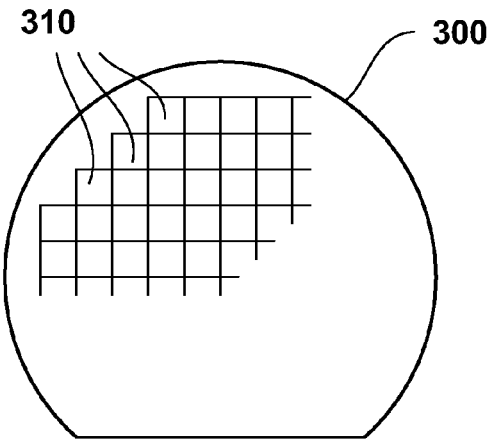
FIG. 3 is a top view of a semiconductor wafer or substrate containing semiconductor dies according to an embodiment.

FIG. 3 is a top view of a wafer 300 or substrate containing semiconductor dice in accordance with an embodiment. With reference to FIG. 3, a semiconductor die 310 is produced from the silicon wafer 300 that contains at least one of the floating gate structures such as are depicted in FIGS. 1T and 1U. A die 310 is an individual pattern, typically rectangular, on a substrate such as substrate 110 (FIG. 1A) that contains circuitry to perform a specific function. A semiconductor wafer 300 will typically contain a repeated pattern of such dice 310 containing the same functionality. The die 310 can further contain additional circuitry, perhaps including such complex devices as a monolithic processor with multiple functionality. The die 310 is typically packaged in a protective casing (not shown) with leads extending therefrom (not shown) providing access to the circuitry of the die 310 for unilateral or bilateral communication and control. In an embodiment, the die 310 may be incased in a host such as a chip package (not shown) such as a chip-scale package (CSP).

Figure 4:
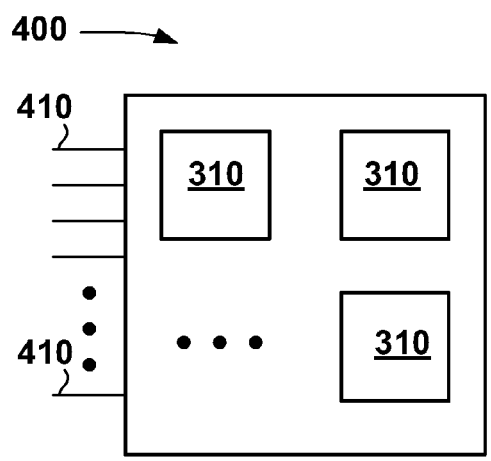
FIG. 4 is a block diagram of a circuit module according to an embodiment.

FIG. 4 is a block diagram of a circuit module 400 in accordance with an embodiment. As shown in FIG. 4, two or more dice 310 (at least one of which contains at least one of the floating gate structures such as are depicted in FIG. 1T or 1U, respectively in accordance with various embodiments) may be combined, with or without protective casing, into a host such as a circuit module 400 to enhance or extend the functionality of an individual die 310. In an embodiment, the circuit module 400 may be a combination of dice 310 representing a variety of functions, or a combination of dice 310 containing the same functionality. Some examples of a circuit module 400 include memory modules, device drivers, power modules, communication modems, processor modules and application-specific modules and can include multi-layer, multi-chip modules. In an embodiment, the circuit module 400 may be a sub-component of a variety of electronic systems, such as a clock, a television, a cell phone, a personal computer, an automobile, an industrial control system, an aircraft, a hand-held device, and others. In an embodiment, the circuit module 400 may have a variety of leads 410 extending therefrom providing unilateral or bilateral communication and control.

Figure 5:
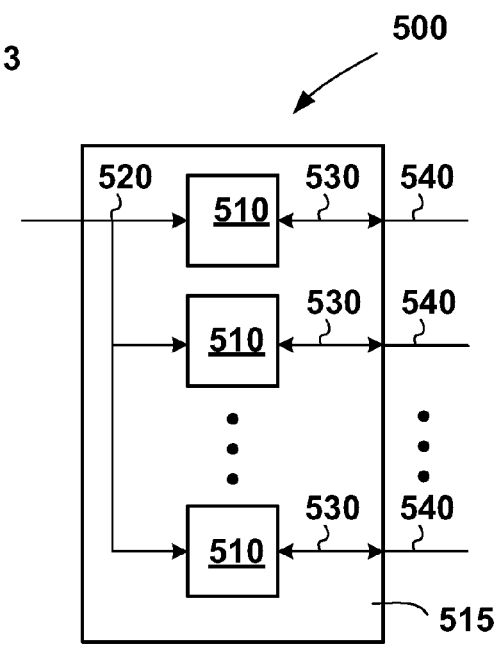
FIG. 5 is a block diagram of a memory module according to an embodiment.

FIG. 5 is a block diagram of a memory module 500 according to an embodiment. FIG. 5 shows one embodiment of a circuit module as a memory module 500 containing a floating gate structure such as are depicted in FIG. 1T or 1U. The memory module 500 is a host that generally depicts a Single In-line Memory Module (SIMM) or Dual In-line Memory Module (DIMM). A SIMM or DIMM may generally comprise a printed circuit board (PCB) or other support structure containing a series of memory devices. While a SIMM will have a single in-line set of contacts or leads, a DIMM will have a set of leads on each side of the support with each set representing separate I/O signals. The memory module 500 may include multiple memory devices 510 contained on a support 515, the number depending upon the desired bus width and the desire for parity. In an embodiment, the memory module 500 contains memory devices 510 on both sides of the support 315. In an embodiment, the memory module 500 accepts a command signal from an external controller (not shown) on a command link 520 and provides for data input and data output on data links 530. The command link 520 and data links 530 may be connected to leads 540 extending from the support 515. The leads 540 are shown for conceptual purposes and are not limited to the positions shown in FIG. 5.

Figure 6:
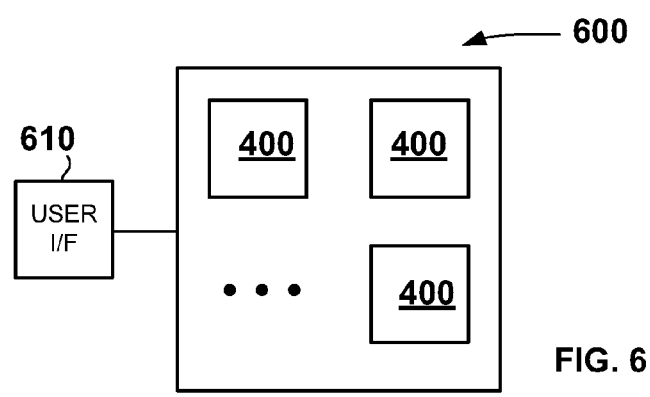
FIG. 6 is a block diagram of an electronic system according to an embodiment.

FIG. 6 is a block diagram of an electronic system 600 according to an embodiment. FIG. 6 shows another host type such as an electronic system 600 containing one or more circuit modules 400 as described above containing at least one of the floating gate structure embodiments. The electronic system 600 generally contains a user interface 610. The user interface 610 provides a user of the electronic system 600 with some form of control or observation of the results of the electronic system 600. Some examples of the user interface 610 include the keyboard, pointing device, monitor and printer of a personal computer; the tuning dial, display and speakers of a radio; the ignition switch and gas pedal of an automobile; and the card reader, keypad, display and currency dispenser of an automated teller machine. The user interface 610 can further describe access ports provided to the electronic system 600. Access ports are used to connect an electronic system to the more tangible user interface components previously exemplified. One or more of the circuit modules 400 can be a processor providing some form of manipulation, control or direction of inputs from or outputs to the user interface 610, or of other information either preprogrammed into, or otherwise provided to, the electronic system 600. As will be apparent from the lists of examples previously given, the electronic system 600 will often contain certain mechanical components (not shown) in addition to the circuit modules 300 and the user interface 610. It will be appreciated that the one or more circuit modules 400 in the electronic system 600 can be replaced by a single integrated circuit. Furthermore, the electronic system 600 may be a sub-component of a larger electronic system.

Figure 7:
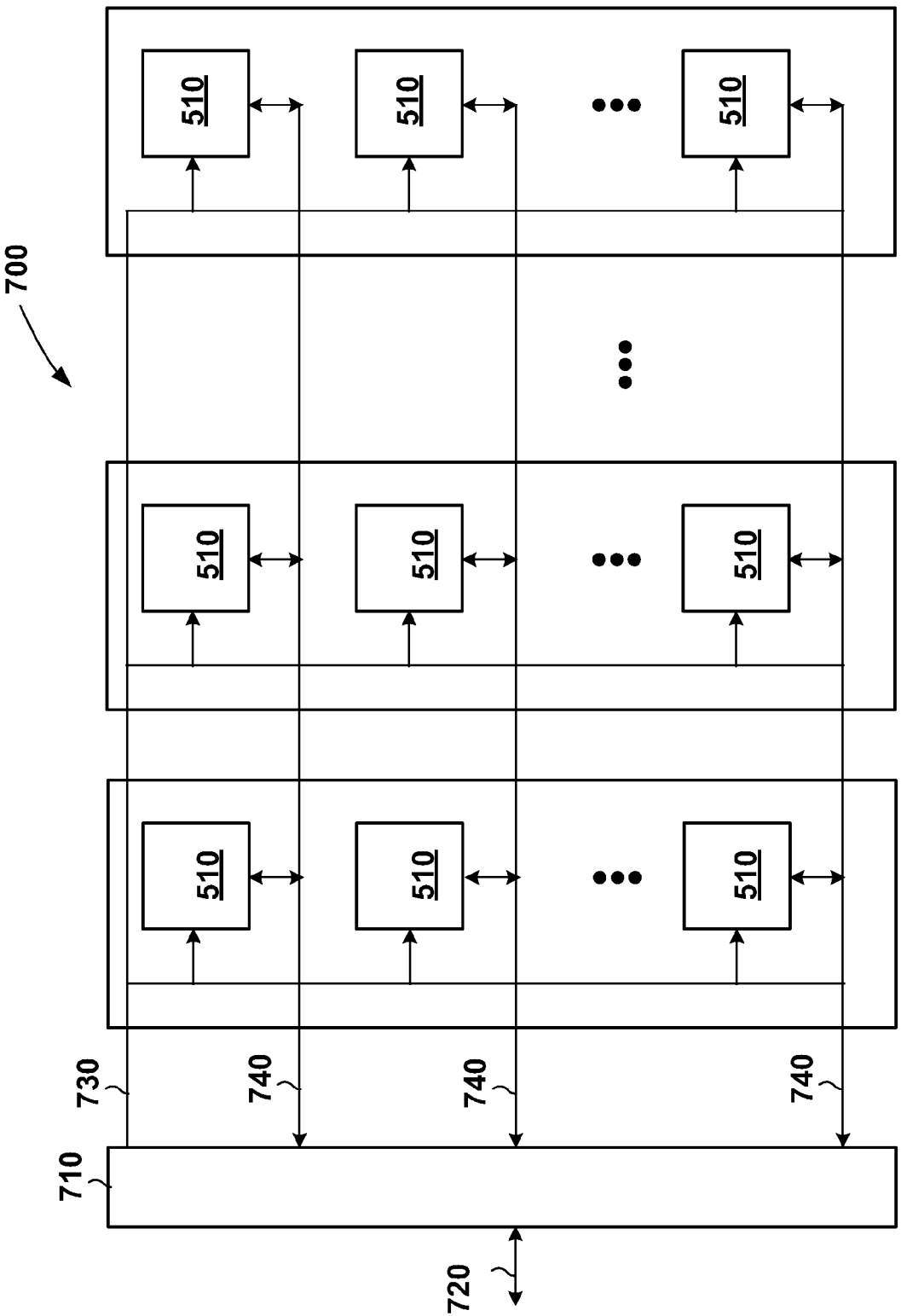
FIG. 7 is a block diagram of a memory system according to an embodiment.

FIG. 7 is a block diagram of a memory system 700 according to an embodiment. FIG. 7 shows an embodiment of an electrical device at a system level. The memory system 700 acts as a higher-level host that contains one or more memory devices 510 as described above including at least one of the floating gate structure embodiments, and a memory controller 710 that can also include circuitry that is connected with a buried digit line structure as set forth herein. The memory controller 710 provides and controls a bidirectional interface between the memory system 700 and an external system bus 720. The memory system 700 accepts a command signal from the external system bus 720 and relays it to the one or more memory devices 510 on a command link 730. The memory system 700 provides for data input and data output between the one or more memory devices 510 and the external system bus 720 on data links 740.

Figure 8:
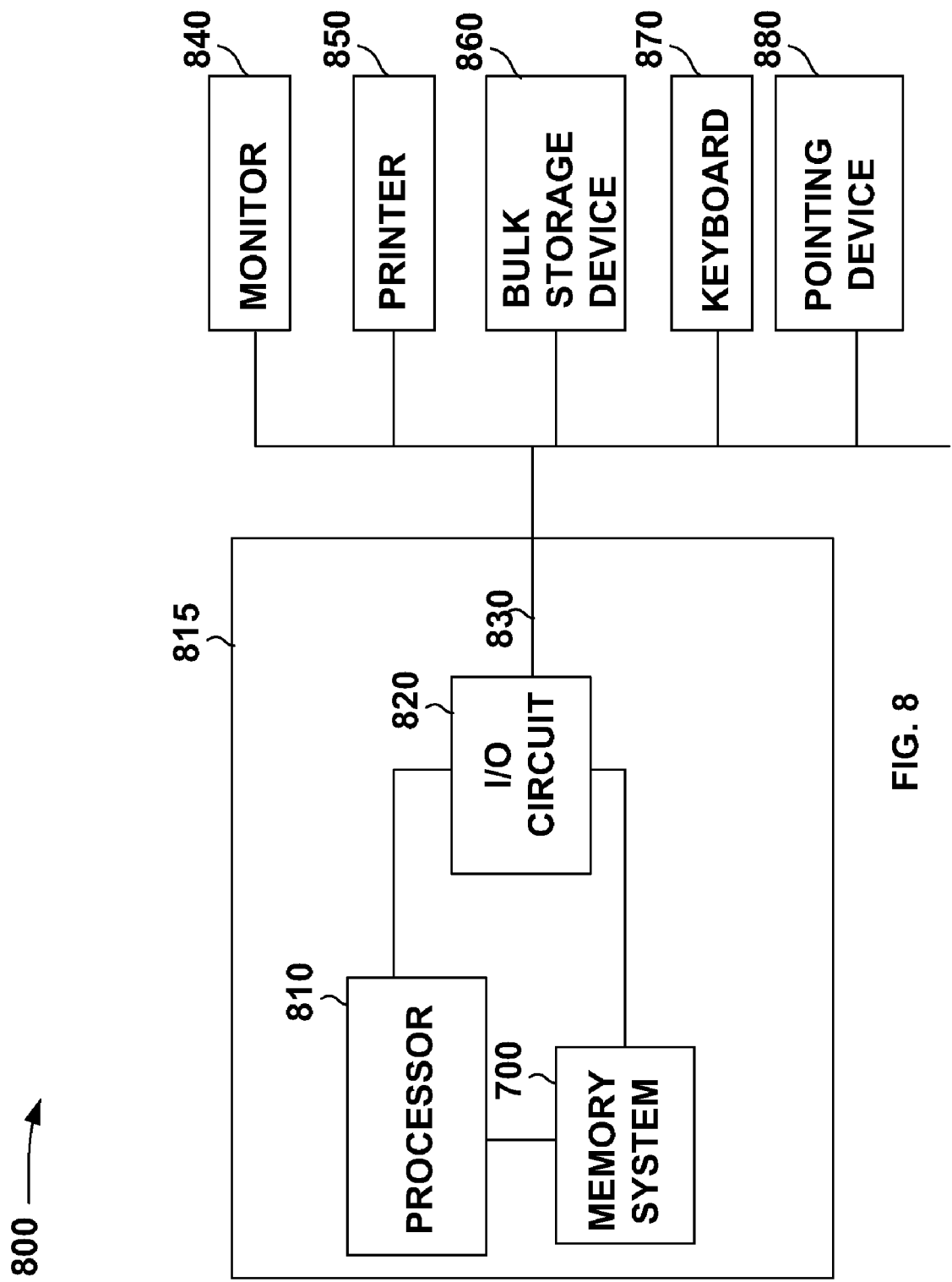
FIG. 8 is a block diagram of a computer system according to an embodiment.

FIG. 8 is a block diagram of an electronic system, including a computer system 800, according to an embodiment. The computer system 800 contains a processor 810 and a memory system 700 housed in a computer unit 815. The computer system 800 is but one example of an electronic system containing another electronic system, i.e. the memory system 700, as a sub-component. In an embodiment, the computer system 800 contains an I/O circuit 820 that is coupled to the processor 810 and the memory system 700. In an embodiment, the computer system 800 contains user interface components that are coupled to the I/O circuit 820. In an embodiment, a plurality of floating gate structures is coupled to one of a plurality of I/O pads or pins 830 of the I/O circuit 820. The I/O circuit 820 can be coupled to one or more of a monitor 840, a printer 850, a bulk storage device 860, a keyboard 870 and a pointing device 880. It will be appreciated that other components are often associated with the computer system 800 such as modems, device driver cards, and additional storage devices, etc. It will further be appreciated that the processor 810, the memory system 700, the I/O circuit 820 and partially isolated structures or data storage devices of computer system 800 can be incorporated on a single integrated circuit. Such single-package processing units reduce the communication time between the processor 810 and the memory system 700.

This Detailed Description refers to the accompanying drawings that show, by way of illustration, specific aspects and embodiments in which the present disclosure may be practiced. These embodiments are described in sufficient detail to enable those skilled in the art to practice the disclosed embodiments. Other embodiments may be utilized and structural, logical, and electrical changes may be made without departing from the scope of the present disclosure. The various embodiments are not necessarily mutually exclusive, as some embodiments can be combined with one or more other embodiments to form new embodiments.

The term "horizontal" as used in this document is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over"

and "under" are defined with respect to the conventional plane or surface being on the top surface of the wafer or substrate, regardless of the orientation of the wafer or substrate. The Detailed Description is, therefore, not to be taken in a limiting sense, and the scope of this disclosure is defined only by the appended claims, along with the full scope of equivalents to which such claims are entitled.

The Abstract is provided to comply with 37 C.F.R. §1.72 (b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

What is claimed is:

1. A process comprising:
    forming a spacer first mask above a substrate;
    etching through an antireflective coating (ARC) layer and a carbon layer using the spacer first mask to form a spacer second mask that includes a portion of the ARC layer disposed upon a portion of the carbon layer;
    etching through a nitride layer using the spacer second mask to form a first pillar that includes a portion of the carbon layer disposed upon the nitride layer;
    forming a spacer third mask that includes the first pillar disposed upon a polycrystalline silicon layer;
    forming a second pillar using the spacer third mask, wherein the second pillar includes a portion of the nitride layer disposed upon a portion of a polycrystalline silicon layer, a portion of the polycrystalline silicon being disposed upon a gate oxide layer, the gate oxide layer disposed upon a semiconductive substrate, and wherein the semiconductive substrate includes a trench; and
    forming a floating gate by removing the portion of the nitride layer and filling a pinnacle polysilicon to contact a portion of the polycrystalline silicon layer.

2. The process of claim 1, further including:
    forming a gate select oxide above the floating gate; and
    forming a gate select above the floating gate and above and on the gate select oxide.

3. The process of claim 1, wherein forming the spacer first mask includes:
    patterning a resist upon the ARC;
    forming a first dielectric film over the resist; and
    spacer etching the first dielectric film to form the spacer first mask.

4. The process of claim 1, wherein forming the spacer third mask includes:
    forming a second dielectric film over the first pillar; and
    spacer etching the second dielectric film.

5. The process of claim 4, wherein forming the polysilicon pinnacle includes:
    forming the second pillar;
    removing the second dielectric film;
    filling a bulk dielectric over the portion of the nitride layer;
    removing the portion of the nitride layer to form a recess; and
    filling polysilicon into the recess.

6. The process of claim 1, wherein forming the first pillar includes etching the nitride layer in the presence of at least one fluorocarbon compound.

7. The process of claim 1, wherein forming the second pillar includes etching the polysilicon layer in the presence of a halogen compound.

8. The process of claim 1, wherein filling a pinnacle polysilicon to contact a portion of the polycrystalline polysilicon includes depositing polysilicon into a geometry in a range from about 18 nm to about 22 nm, followed by etching back excess polysilicon.

9. A process comprising:
    forming a spacer first mask above a substrate;
    etching through an antireflective coating (ARC) layer and a carbon layer using the spacer first mask to form a spacer second mask that includes a portion of the ARC layer disposed upon a portion of the carbon layer;
    etching through a nitride layer using the spacer second mask to form a first pillar that includes a portion of the carbon layer disposed upon the nitride layer;
    forming a spacer third mask that includes the first pillar disposed upon a semiconductive layer;
    forming a second pillar using the spacer third mask, wherein the second pillar includes a portion of the nitride layer disposed upon a portion of the semiconductive layer, a portion of the semiconductive layer being disposed upon a gate dielectric layer, the gate dielectric layer disposed upon a semiconductive substrate, and wherein the semiconductive substrate includes a trench;
    forming a floating gate by removing the portion of the nitride layer and filling a semiconductive pinnacle to contact a portion of the semiconductive layer;
    forming a gate select dielectric above the floating gate; and
    forming a gate select above the floating gate and above and on the gate select dielectric.

10. The process of claim 9, wherein forming the spacer first mask includes:
    patterning a resist upon the ARC;
    forming a first dielectric film over the resist; and
    spacer etching the first dielectric film to form the spacer first mask.

11. The process of claim 9, wherein forming the spacer third mask includes:
    forming a second dielectric film over the first pillar; and
    spacer etching the second dielectric film.

12. The process of claim 11, wherein forming the semiconductive pinnacle includes:
    forming the second pillar;
    removing the second dielectric film;
    filling a bulk dielectric over the portion of the nitride layer;
    removing the portion of the nitride layer to form a recess; and
    filling a semiconductive material into the recess.

13. The process of claim 9, wherein forming the first pillar includes etching the nitride layer in the presence of at least one fluorocarbon compound.

14. The process of claim 9, wherein forming the second pillar includes etching the semiconductive layer in the presence of a halogen compound.

15. The process of claim 9, wherein filling a semiconductive pinnacle to contact a portion of the semiconductor includes depositing a semiconductor into a geometry in a range from about 18 nm to about 22 nm, followed by etching back excess semiconductor.

* * * * *